United States Patent [19]

Heller

[11] Patent Number: 5,258,261
[45] Date of Patent: Nov. 2, 1993

[54] ANTI-BLOCKING, WATER SOLUBLE TOP COAT FOR COLOR PROOFING FILMS

[75] Inventor: Michael B. Heller, Inver Grove Heights, Minn.

[73] Assignee: Minnesota Mining and Manufacturing Company, St. Paul, Minn.

[21] Appl. No.: 752,776

[22] Filed: Aug. 30, 1991

[51] Int. Cl.$^5$ ............................................. G03C 1/492
[52] U.S. Cl. .................................... 430/273; 430/961
[58] Field of Search ................ 430/273, 961, 259, 271

[56] References Cited

U.S. PATENT DOCUMENTS

| | | |
|---|---|---|
| 3,136,637 | 6/1964 | Larson . |
| 4,268,611 | 5/1981 | Okishi et al. .................... 430/273 X |
| 4,304,923 | 12/1981 | Rousseau ............................. 560/26 |
| 4,339,525 | 7/1982 | Bratt et al. ...................... 430/293 X |
| 4,885,225 | 12/1989 | Heller et al. ......................... 430/160 |

*Primary Examiner*—Roland Martin
*Attorney, Agent, or Firm*—Gary L. Griswold; Walter N. Kirn; Mark A. Litman

[57] ABSTRACT

A photosensitive, resist-imageable color element comprises a transparent support laser, colored photosensitive resist layer, and a water-removable polymeric layer with water-insoluble polymeric particles in the water-removable polymeric layer.

25 Claims, No Drawings

ANTI-BLOCKING, WATER SOLUBLE TOP COAT FOR COLOR PROOFING FILMS

FIELD OF THE INVENTION

The present invention relates to the incorporation of a non-permanent water soluble protective top coat for overlay color proofing films. The protective top coat prevents blocking of the films and improves vacuum drawdown without optical interference, reduction in image transparency, gloss or quality. The resulting overlay color films are used to form multicolored images for proofing color separation negatives or positives in preparation for multicolor lithographic reproduction.

BACKGROUND OF THE INVENTION

In color reproduction, it is often necessary to verify the color accuracy of separation negatives or positives used in the printing process. The use of overlay and surprint proofing systems for this application is well known in the literature. Even though surprint proofing systems have by far received the most acceptance for application where color assessment is critical, overlay proofing systems provide a more economical and more productive method for non-critical color prepress applications. Some examples of different types of overlay proofing films which are wet processed are described in U.S. Pat. Nos. 3,136,637; 4,299,906; 4,469,772; 4,482,625; 4,487,823; 4,748,102; 4,952,482; 5,001,037; and DE 37 20 724 A1; DE 38 13 322 A1; EP 338,786 A2; EP 404,507 patent applications. The technologies used to image these films are photosensitive systems well known in the art. Overlay color proofing films which are based on dry peel apart processes provide another method of generating multicolored proofs. Some examples of these can be found in U.S. Pat. Nos. 4,174,216; 4,334,006; 4,396,700; and EP 385,466 A2 patent application. Even though the dry process peel apart systems provide a convenient method of generating images without the use of wet developers, the image quality of these system are generally not as good as those generated by wet processes.

Other improvements to overlay systems, as described in U.S. Pat. Nos. 4,634,652 and 4,748,101, have included treatment of the polyester support for increased transparency and clarity. The intent of these permanent treatments are to reduce the internal reflections within the composite proof to provide a better match to the printed sheet. Particulate layers are positioned either on the opposite side of the carrier from the photosensitive color layer is coated or lie below the photosensitive color layer between it and the carrier.

The use of protective layers for preventing blocking or protecting the image have been described in U.S. Pat. Nos. 4,719,169; 4,902,594; and 4,999,266. In each of these patents, the protective layer is a permanent layer that is applied after the image is formed. The layer provides no protection for the film prior to image formation and subsequent lamination. The layer consists of a non-water soluble thermoplastic resin which may or may not contain particulate matter.

The use of particulate matter in adhesives for anti-blocking characteristics is well known. A specific example of using organic polymeric beads with a narrow molecular weight distribution in the adhesive layer of a surprint color proof is described in U.S. Pat. No. 4,885,225. The narrow distribution of beads allows one to incorporate a low concentration of beads into the adhesive layer without introducing optical interference or reduction in adhesive performance.

In an overlay construction, unlike a surprint type film, an adhesive layer is not the top layer in the construction. The exposed coated surface on an overlay film prior to development is either a photosensitive layer, which may or may not contain a colorant, or an oxygen barrier layer. An oxygen barrier layer is necessary when photopolymers or monomers are used which are quenched by triplet oxygen during the photoimaging process, typically acryloyl and methacryloyl polymerizable systems. The surface of these layer is typically very smooth, making it difficult to achieve uniform and intimate contact with separation negatives or positives during vacuum drawdown prior to the imaging process. The oxygen barrier layers are comprised of water soluble polymers which may block when subjected to moisture if the smooth top layer is allowed to come into contact with a second smooth surface. When photopolymers or monomers are used as the photosensitive element in the construction, the photosensitive layer and oxygen barrier layer are often soft and easily embossed during the photoimaging process. When non-uniform contact between the separation and photosensitive element occurs, a pattern results in the final image.

SUMMARY OF THE INVENTION

The present invention provides a color proofing element comprising, in order (a) a permanent transparent carrier or support layer, (b) a photosensitive color layer and (c) a non-permanent water soluble protective layer containing particulate organic polymeric beads.

A negative-acting photosensitive system can be used to produce a multicolored composite image can be obtained by performing the following procedure using the aforesaid photosensitive element;

(i) exposing said presensitized sheet to actinic radiation through a color separation negative corresponding to the pigment of said color coating thereby crosslinking the exposed areas of the photosensitive element and rendering said color coating insoluble in an aqueous alkaline developing medium (creating a latent image);

(ii) developing said image with an aqueous alkaline developing medium whereby the protective layer is totally removed, the unexposed color coating is removed and the exposed color coating remains;

(iii) repeating steps (i)–(ii) with additional presensitized elements as described above, each of said presensitized elements being of a different color.

(iv) registering each color imaged film on a substrate to form a multicolored composite image.

DETAILED DESCRIPTION OF THE INVENTION

The construction according to the present invention would typically comprise a transparent carrier (generally having an adhesion promoted or roughened surface); a colored photopolymerizable layer; and a water soluble protective layer containing a narrow distribution of organic polymeric beads.

In a preferred embodiment, the carrier is composed of a dimensionally and chemically stable base material. In particular the carrier is polyethylene terephthalate having a thickness of 1 to 10 mils (0.025 to 0.25 nm) and more preferably a thickness of 2 to 3 mils (0.05 to 0.076 nm). The carrier must be capable of holding the image during and after development which may require some treatment of the polyester surface. Adhesion promotion can be achieved through chemically treated films, such as Melinex TM 505 from ICI, and/or treatment with corona discharge flame treatment, or irradiation (as in U.S. Pat. No. 4,879,176) to promote adhesion of the image without interference in development of the non-imaged areas.

Coated onto the carrier surface is a photosensitive color layer which typically comprises a photopolymerizable oligomer, colorant, initiator system, binders and other optional components such as wetting agents, surfactants, coating rheology modifiers, optical brighteners, plasticizers, residual solvents, fillers etc. The photosensitive color layer is coated onto the adhesion promoted surface of the carrier using a mixture of solvents which give rise to the best coating quality and solution stability. Representative solvents include ketones, alkyl ethers or acetates of propylene glycol, alkyl ethers or acetates of ethylene glycol, dioxalane, butyrolactone, and alcohols.

The photopolymerizable oligomer comprises a multifunctional acrylate whose function is to form a high molecular weight polymer upon initiation by radiation (e.g., ultraviolet radiation or visible light) generated radicals. The molecular weight of the acrylated oligomer influences several performance characteristics of the final coated films such as the tack, of the coated film, the strength of the developer necessary to develop the image and the quality of the image attained. If the film imparts too much tack then it is difficult to manufacture the material in a production coating process without disruption of the film, in turn, giving rise to poor coating quality. The strength of the developer required to develop the image is generally directly proportional to the molecular weight of the oligomer and the acid content of the oligomer. Oligomers with lower molecular weights and high acid content are easier to develop and therefore do not need very aggressive developers. However, too much acid content or too high a molecular weight can cause destabilization of the pigment dispersions when acidic binders are used to disperse the pigments. Some examples of oligomers non-exclusively include and multiacrylated urethane oligomers, as described in U.S. Pat. No. 4,304,923. The photo-oligomer is present in the composition in the amount of 45-70% by weight and has a mean molecular weight range of 2500 to 5500.

In the preferred embodiment, the photoinitiator(s) used must not generate a visible color change in the image after exposure. Examples of photoinitiators non-exclusively include; triazines, acetophenones, benzophenones, and thioxanthones. The preferred photoinitiators include Irgacure TM 907(2-methyl-1-(4-(methylthio)phenyl)-2-(4-morpholinyl)-1-propane) from Ciba Geigy, Irgacure TM 369 from Ciba Geigy, Quantacure TM ITX (isopropylthioxanthone) from Biddle Sawyer and triazines tethered to alkylarylpolyether alcohols U.S. application Ser. No. 07/752,775 with the title "Light-Sensitive Article Containing Non-Migrating Halomethyl-1,3,5-Triazines.") and are present in the composition in the amount of 1.0-15% by weight. The optimum amount of initiator will be dependent upon the oligomer type used and the light filtering effect of the pigment used.

Pigments or dyes may be used as colorants in the photosensitive color layer; however, pigments are preferred since they provide more light stable colored images. The pigments are generally introduced into the photosensitive formulation in the form of a millbase comprising the pigment dispersed with a binder and suspended into a solvent or mixture of solvents. Many different pigments are available and are well known in the art. The pigment type and color are choosen so that the coated colored element is matched to a preset color target or specification set by the industry. The type of dispersing resin and the pigment to resin composition ratio choosen are dependent upon the pigment type, surface treatment on the pigment, dispersing solvent and milling process. Some examples of resins suitable for generating millbases which are compatible with the aforementioned photo-oligomers non-exclusively include; Polyvinyl acetate/crotonic acid copolymers, styrene maleic anhydride half esters resins, acrylic and methacrylic polymers and copolymers, polyvinyl acetals, polyvinyl acetals modified with anhydrides and amines, hydroxy alkyl cellulose resins and styrene acrylic resins. The primary composition of the dispersing resin is an acidic resin, however, some non-acidic resins may be present. In some combinations, a dispersing agent may be necessary to achieve optimum dispersion quality. Some examples of dispersing agents non-exclusively include; polyester/polyamine copolymers, Disperse Aids TM from Daniels, PKE 1370 polyester resin from Biddle Sawyer, alkylarylpolyether alcohols, and acrylic resins. Other components may also be included in the millbase such as surfactants to improve solution stability, fluorescent materials, optical brighteners, UV absorbers, fillers, etc. The preferred composition of the millbase comprises 30-71% by weight pigment, 15-30% by weight acidic resin, 0-25% non-acidic resin, 0-20%, more preferably 0-10% dispersing agents. Additional binders may also be included in the photosensitive color formulation to balance developability and tack. Some examples of additional binders which are compatible with the aforementioned photo-oligomers and millbases non-exclusively include; Polyvinyl acetate/crotonic acid copolymers, styrene maleic anhydride half esters resins, acrylic and methacrylic polymers and copolymers, polyvinyl acetals, polyvinyl acetals modified with anhydrides and amines, and styrene acrylic resins. In the preferred composition of the photosensitive color layer, the pigment is present in the amount of 5-20% by weight, the acidic resin in the amount of 10-20% by weight and non-acidic resin in the amount of 0-5% by weight.

Overlying the light sensitive color layer is a continuous developer soluble resinous protective layer which may also function as an oxygen barrier containing a narrow distribution of organic polymeric beads. If the photosensitive color layer is sensitive to oxygen quenching during the exposure process, then an oxygen barrier layer is necessary. In such a case, the protective layer can function as both a barrier for oxygen and as a protection layer for the underlying photosensitive color layer. The protective layer is coated onto the photosensitive color layer using an aqueous solution of water soluble resins. Preferred water soluble resins non-exclusively include alkyl ethers of cellulose, polyvinyl alcohols and polyvinyl pyrrolidone. The organic polymeric beads are added to the water soluble resinous layer to provide an uneven surface of the protective coating. The disruption of the smooth surface of the coating gives rise to several advantages, such as anti-blocking characteristics of the films, especially under humid conditions (as seen in example 2); easier handling of the films, such as the sliding of the graphic arts separation film over the surface of the photosensitive element or pulling sheets out of a package due to less friction and tack (as seen in example 3); and a more productive proof making process due to the decrease in drawdown time required to achieve acceptable contact in the contact frame with the graphic arts separation film (as demonstrated in example 4). If the particle size distribution of the organic polymeric beads is too broad, the smaller particles may be too small to be of any use and may cause unacceptable haze in the coating (as demonstrated in example 5); and the larger particles may cause disruption of the colored image (matte surface or deglossing effect) and may also interfere with the uniform contact between the surface of the photosensitive element and the graphic arts separation film during the exposure process. Using a narrow distribution of beads allows one to more effectively use beads with the desired average diameter required to achieve the desired effect and avoid disadvantages such as haze and poor contact in the exposure frame. In the preferred embodiment, the organic polymeric beads have a mean average diameter from 4–10 microns and are present in the protective layer in an amount of 0.05–2.0%, more preferably 0.5–2.0%. The protective layer thickness is coated between 0.3 to 1.7 g/m². Other ingredients may be added such as mold inhibitors, anti-halation dyes, filter dyes, solvents, wetting agents, etc.

These and other aspects of the invention will now be illustrated in the following non-limiting examples:

EXAMPLES

EXAMPLE 1

The following protective coating solution was coated at 0.8 g/m² onto either a photosensitive color layer (as described in example 6) or onto a 2 mil biaxially oriented polyethylene terephthalate polyester film. The formulations described below were used for evaluating the effect of the size and distribution of organic polymeric beads and their concentration in the practice of the present invention (see examples 2 through 5). Included below is also a table listing the mean diameter distribution of the bead lots used;

| EXPERIMENTAL CONDITIONS VARYING PMMA BEAD CONCENTRATIONS (by Weight %) | | | | |
|---|---|---|---|---|
| | Control | high (+) | center (0) | low (−) |
| Vinol ® 205 Polyvinyl alcohol* | 5.6 | 5.6 | 5.6 | 5.6 |
| Vinol ® 107 Polyvinyl alcohol* | 2.4 | 2.4 | 2.4 | 2.4 |
| MA-6 PMMA Beads* (1% T.S.) | 0.0 | 16.0 | 4.0 | 0.4 |
| KATHON ® CG-ICP Preservative* | 0.1 | 0.1 | 0.1 | 0.1 |
| D.I. Water | 91.9 | 75.9 | 87.9 | 91.5 |

*Vinol ® 205 and Vinol ® 107 are available from Air Products MA-6 PMMA Beads composition described in U.S. Pat. No. 4,885,225
Kathon ® CG/ICP is available from Rohm and Hass

| PMMA BEAD DISTRIBUTION (% Frequency by Number) | | | | |
|---|---|---|---|---|
| Mean Diameter in Microns | PMMA Bead Lot Number | | | |
| | D-113 | D-148 | D-153 | D-179 |
| >15.0 | | | 0.5 | |
| 14.0–15.0 | | | 0.4 | |
| 13.0–14.0 | | 0.1 | 0.6 | |
| 12.0–13.0 | | 0.8 | 1.0 | |
| 11.0–12.0 | | 1.0 | 1.0 | |
| 10.0–11.0 | | 3.7 | 3.1 | |
| 9.0–10.0 | | 7.8 | 8.3 | |
| 8.0–9.0 | | 13.7 | 55.4 | |
| 7.0–8.0 | | 28.1 | 29.6 | |
| 6.0–7.0 | | 2.6 | | |
| 5.0–6.0 | | | | |
| 4.0–5.0 | | 0.5 | | |
| 3.0–4.0 | | | | 0.9 |
| 2.0–3.0 | | 0.6 | | 83.8 |
| 1.0–2.0 | 1.3 | 1.9 | | 13.9 |
| 0.0–1.0 | 98.7 | 39.2 | 0.1 | 1.4 |

PMMA (Polymethylmethacrylate) Beads were supplied by 3M Fine Chemical Mfg. Division, Rochester, NY
The mean diameter distribution by Number was measured on a Horiba CAPA-700 Particle Analyzer

EXAMPLE 2

Protective coating solutions for each of the PMMA Bead lots were coated onto a polyethylene terephthalate polyester film upon which had been coated and dried the black photosensitive color solution as described in example 6 at the three different concentrations levels. Each of these samples were then subjected to a blocking test under the following conditions: four sheets of material to be tested were cut to dimensions of 30.5 cm by 13 cm and stacked with the coated side of one sheet in contact with the back (uncoated) side of the next sheet. A flat, smooth aluminum plate of the same dimensions was placed over the material. The aluminum plate was of uniform thickness and weighed 526 grams; this resulted in a pressure of 1.35 g/cm² on the material during the test. (This pressure was chosen to correspond with the pressure at the bottom of a stack of 160 sheets of boxed proofing material.) Two sets of material were then exposed to 60° C. for 24 hours at 6% relative humidity and 80% relative humidity. On cooling, the material sheets were separated. Any tendency to cling together or disrupt any coating layer was regarded as blocking and was graded visually from 0 to 6, with 0 being the case with no blocking and 6 being completely blocked such that the layers are disrupted on separation. The table below summarizes the results from this test.

| BLOCKING TEST (KRAL Grade*) | | | |
|---|---|---|---|
| Bead Distribution | Experimental Condition | 6% Relative Humidity | 80% Relative Humidity |
| D-153 | high (+) | 0.0 | 0.8 |
| D-153 | Center (0) | 0.0 | 0.8 |
| D-153 | low (−) | 0.2 | 0.8 |
| D-113 | high (+) | 0.0 | 2.5 |
| D-113 | Center (0) | 0.0 | 4.0 |
| D-113 | low (−) | 0.2 | 4.8 |
| D-148 | high (+) | 0.0 | 0.3 |
| D-148 | Center (0) | 0.2 | 0.2 |
| D-148 | low (−) | 0.2 | 0.8 |
| D-179 | high (+) | 0.0 | 1.2 |
| D-179 | Center (0) | 0.2 | 1.0 |
| D-179 | low (−) | 0.0 | 1.0 |
| no beads | Control | 0.2 | 3.8 |
| | No Protective Coat | 6.0 | 6.0 |

*The KRAL Grades are based on <3.0 is acceptable, 3.0 is marginal and >3.0 is unacceptable When no protective coat was present on the element severe blocking was observed under both relative humidity conditions. Without the PMMA beads present or present with the mean distribution of particle sizes less than 4 microns in diameter, in particular at low concentrations levels, the resistance to blocking under humid condition was not acceptable.

EXAMPLE 3

Protective coating solutions for each of the PMMA Bead lots were coated onto a polyethylene terephthalate polyester film upon which had been coated and dried the black photosensitive color solution as described in example b 6 at the three different concentrations levels. The samples were then tested for their ease of slip between the front of the top sheet and the back of the second sheet. The test was intended to simulate the ease of withdrawing an element from a package of material. The lower the number indicated the easier it was to slide materials on top of each other. The elements were tested on a 3M-90 Slip/Peel Tester in accordance with test procedure ASTM Spec. D-1894.

| Bead Distribution | SLIP TEST Experimental Condition | Coefficient of Friction |
| --- | --- | --- |
| D-153 | high (+) | 0.20 |
| D-153 | Center (0) | 0.22 |
| D-153 | low (−) | 0.23 |
| D-113 | high (+) | 0.25 |
| D-113 | Center (0) | 0.25 |
| D-113 | low (−) | 0.27 |
| D-148 | high (+) | 0.20 |
| D-148 | Center (0) | 0.19 |
| D-148 | low (−) | 0.20 |
| D-179 | high (+) | 0.22 |
| D-179 | Center (0) | 0.24 |
| D-179 | low (−) | 0.24 |
| no beads | Control | 0.30 |
|  | No Protective Coat | 0.34 |

When no PMMA Beads were present in the protective layer or no protective layer is present, the elements have the least resistance to slip. As the concentration of the beads was decreased, proportionally the resistance to slip increased. The resistance to slip also increased as the percentage of mean diameter beads increases below 2 microns.

EXAMPLE 4

Protective coating solutions for each of the PMMA Bead lots were coated onto a polyethylene terphthalate polyester film upon which had been coated and dried the black photosensitive color solution described in example 6 at the three different concentrations levels. A draw down test was performed on the samples to simulate the efficiency of bringing the photosensitive elements into intimate contact with a graphic arts separation film. The faster the draw down time the more productive the proof making process. A Bekk smoothness/porosity tester Model 131-ED was used for the test. The values in the following Table are expressed as time in seconds for passing 10 cm³ of air at an underpressure of 38 mm Hg between the sample and a polished surface with an area of 19 cm² with a dead weight load of 1 Kg/cm².

| Bead Disribution | DRAW DOWN TEST Experimental Condition | Average of 3 Samples in seconds |
| --- | --- | --- |
| D-153 | high (+) | 762 |
| D-153 | Center (0) | 3,710 |
| D-153 | low (−) | >10,000 |

| Bead Disribution | -continued DRAW DOWN TEST Experimental Condition | Average of 3 Samples in seconds |
| --- | --- | --- |
| D-113 | high (+) | 7,025 |
| D-113 | Center (0) | >15,000 |
| D-113 | low (−) | >15,000 |
| D-148 | high (+) | 172 |
| D-148 | Center (0) | 2,653 |
| D-148 | low (−) | >6,000 |
| D-179 | high (+) | 2,108 |
| D-179 | Center (0) | >11,821 |
| D-179 | low (−) | >10,000 |
| no beads | Control | >10,000 |

The test results clearly showed that at low concentrations and distribution of beads containing no beads with diameters greater than 4 microns the efficiency of drawdown is poor. The higher number of seconds to achieve efficient drawdown would translate to longer vacuum drawdown times in the exposure frame prior to exposure to insure intimate contact between the photosensitive element and the graphic arts separation film. This would extend the process time for producing a proof. If intimate contact between the element and graphic arts separation film is not achieved, poor image quality may result.

EXAMPLE 5

Protective coating solutions for each of the PMMA Bead lots were coated onto a 2 mil (0.051 mm) polyethylene terephthalate polyester film. In order to evaluate the optical clarity of the protective layer as a function of PMMA bead distribution and concentration, samples were prepared and measured on a Gardner/Neotec Haze Meter Model #XL-211 in the transmission mode. Acceptable haze values range from 0.79 to 1.50.

| Bead Distribution | HAZE TEST Experimental Condition | Average of 3 % Haze |
| --- | --- | --- |
| D-153 | high (+) | 1.82 |
| D-153 | Center (0) | 1.01 |
| D-153 | low (−) | 0.78 |
| D-113 | high (+) | 3.83 |
| D-113 | Center (0) | 1.49 |
| D-113 | low (−) | 0.85 |
| D-148 | high (+) | 1.74 |
| D-148 | Center (0) | 1.06 |
| D-148 | low (−) | 0.76 |
| D-179 | high (+) | 2.62 |
| D-179 | Center (0) | 1.41 |
| D-179 | low (−) | 0.78 |
| no beads | Control | 0.76 |

The clarity of the layer decreases as the concentration of PMMA beads increases and as the percentage of mean diameter beads less than 2 microns increases.

EXAMPLE 6

The following example demonstrates the use of a protective layer in an overlay construction to generate a multicolored proof.

A 2.65 mil (0.067 mm) adhesion promoted biaxially oriented polyethylene terephthalate polyester film is first primed by corona discharge treatment . Then the following photosensitive color coating solutions were coated and dried to a reflection optical density representative of the color specifications for each industry color target;

The following pigment millbases were prepared first for incorporation into the photosensitive color coating solution;

| | Millbase Compositions (% by weight) | | | |
|---|---|---|---|---|
| | Green Shade Yellow | Red Shade Yellow | Red Shade Magenta | Blue Shade Magenta |
| Mobay Pigment YB-5785 | 11.6 | | | |
| Sun Yellow Pigment 275-0005 | | 11.6 | | |
| Sun Magenta Pigment 234-0071 | | | 11.2 | |
| Mobay Magenta Pigment RV-6803 | | | | 6.8 |
| Butvar ® B-98* | 2.7 | 2.7 | 1.5 | 2.3 |
| Joncryl ® 67* | 5.0 | 2.7 | 6.0 | 2.3 |
| Disperbyk ® 161* | 0.6 | 0.6 | 1.1 | 0.7 |
| FC-430 | 0.04 | 0.04 | 0.2 | 0.02 |
| Methyl ethyl ketone | 56.0 | 56.0 | 56.0 | 61.4 |
| Propylene glycol mono methyl ether | 24.0 | 24.0 | 24.0 | 26.6 |

| | Green Shade Cyan | Red Shade Cyan | Black |
|---|---|---|---|
| Sun Cyan Pigment 249-0592 | 11.6 | | |
| Sun Cyan Pigment 248-0615 | | 11.6 | |
| Columbia Black Pigment Ravent ® 760 | | | 16.6 |
| Butvar ® B-98* | 3.9 | 4.0 | 3.0 |
| Joncryl ® 67* | 3.9 | 4.0 | 3.0 |
| Disperbyk ® 161* | 0.6 | 0.6 | 1.5 |
| FC-430* | 0.04 | 0.04 | 0.05 |
| Methyl ethyl ketone | 56.0 | 56.0 | 50.0 |
| Propylene glycol mono methyl ether | 24.0 | 24.0 | 20.0 |

*Butvar ® B-98 (Polyvinyl butyral) available from Monsanto
Joncryl ® 67 (Styrene acrylic resin) available from Johnson Wax
Disperbyk ® 161 available from Byk Chemie (dispersing agent)
FC-430 (fluorinated nonionic surfactant CAS# 11114017-3) available from 3M

| PHOTOSENSITIVE COLOR SOLUTIONS (% by Weight) | | | | | |
|---|---|---|---|---|---|
| | % Solids | YELLOW | MAGENTA | CYAN | BLACK |
| Green Shade Yellow Millbase | 20 | 16.1 | | | |
| Red Shade Yellow Millbase | 20 | 3.5 | | | |
| Red Shade Magenta Millbase | 20 | | 17.0 | | |
| Blue Shade Magenta Millbase | 12 | | 7.5 | | 2.0 |
| Green Shade Cyan Millbase | 20 | | | 13.6 | |
| Red Shade Cyan Millbase | 20 | | | 4.0 | 2.6 |
| Black Millbase | 30 | 0.08 | 0.4 | 0.2 | 18.1 |
| Acrylated Urethane Oligomer P-11* | 64 | 11.5 | 16.7 | 25.8 | 15.3 |
| Acidified Butvar ® B-98* | 21 | 5.7 | 3.6 | 3.8 | 7.2 |
| Triazine Initiator* | 50.6 | 2.9 | 1.3 | 1.6 | 4.1 |
| Joncryl ® 67* | | | 4.0 | 5.0 | 0.9 |
| Methyl ethyl ketone | | 43.2 | 34.8 | 46.0 | 38.9 |
| Propylene glycol mono methyl ether | | 17.0 | 14.7 | | 10.9 |

*Synthesis described in U.S. Pat. No. 4,304,923
Triazine Initiator = m-MOST-ol tethered to Igepal CO-520 (as described in U.S. Pat. application S.N. 07/752775
Acidified Butvar ® B-98 = Butvar ® B-98 modified with succinic anhydride and triethyl amine (as described in U.S. Pat. application S.N. 07/716,316 filed on June 17, 1991)
Joncryl ® 67 (available from Johnson Wax) = Styrene acrylic resin The following water soluble protective coating solution was coated and dried to a dry coating weight of 0.8 g/m² onto the previously coated photosensitive color layer;

| PROTECTIVE COATING SOLUTION | | |
|---|---|---|
| | (% Solids) | (% by Weight) |
| Vinol ® 205 Polyvinyl alcohol | | 5.6 |
| Vinol ® 107 Polyvinyl alcohol | | 2.4 |
| MA-6 PMMA Beads* | 1.0 | 8.0 |
| Kathon ® CG/ICP | | 0.09 |
| D.I. Water | | 83.9 |

*Vinol ® 205 and Vinol ® 107 are available from Air Products
PMMA Beads composition described in U.S. Pat. No. 4,885,225
Kathon ® CG/ICP is available from Rohm and Haas A multicolored proof using the four process color films was imaged and developed as described in the summary. The following developer composition was used to develop the image.

| DEVELOPER SOLUTION | |
|---|---|
| | (% by Weight) |
| Postassium Carbonate | 1.0 |
| Postassium Bicarbonate | 1.0 |
| Surfynol ® 465 | 0.1 |
| Water | 97.9 |

*Surfynol ® 465 (Ethoxylated tetramethyldecynediol) available from Air Products.

A commercially available sample of Igepal ™ CO-520 was obtained commercially which had approximately 5% water present as an impurity. This water was removed by a vacuum azeotropic distillation of a solution containing 1.0 kg of the Igelpal CO-520 ™ in 1.0 L of toluene until the concentration of the solution was approximately 70–80%. Analysis by Karl Fischer indicated water to be present in <100 ppm. The final concentration was determined to be 79.2%. The structure of polyoxyethylene compounds of this type usually only show the mole ratio of ethylene oxide used in their preparation. For Igepal ™ CO-520, this mole ratio is 5. Analysis by mass spectrometry and nmr, however, showed the Igepal ™ CO-520 to be a mixture of the structures shown.

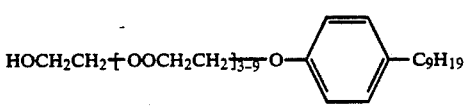

To a slurry of 13.04 g (0.02 mole) of para-MOSTROL/TDI in 70 mL of toluene was added 11.34 g of a dry, solution of Igepal-CO-520 (8.98 g, 0.02 mole) in toluene followed by 0.030 g of dibutyltin dilaurate. The reaction mixture was heated for 3 hours at 60° C. GPC and infrared analysis indicated that the reaction was complete. A clear yellow-brown viscous syrup was isolated by removal of the toluene solvent on a vacuum rotary evaporator. The product para-MOSTOL/TDI/Igepal ™ CO-520 has the structure shown.

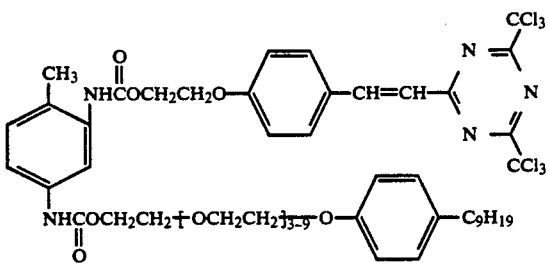

PREPARATIONS

The following preparatory examples illustrate methods for synthesizing photopolymerization initiators (photoinitiators) that are useful in this invention. All percentages are percentages by weight, unless indicated otherwise.

PREPARATION I

This preparation illustrates the synthesis of 2,4-bis(trichloromethyl)-6-[3-(2-hydroxyethoxy)styryl]-1,3,5-triazine, referred to hereinafter as meta-MOSTOL.

A stirred solution of 2,4-bis(trichloromethyl)-6-methyl-1,3,5-triazine (103 g, 0.31 mole), 3-(2-hydroxyethoxy)benzaldehyde (47 g, 0.28 mole), and ammonium acetate (10.5 g) in 270 mL of methanol was refluxed for 12 hours. After the mixture had cooled, an additional 80 mL of methanol was added, followed by 112 mL of water. The product precipitated from the reaction solution, was filtered and dried to yield 74 g of meta-MOSTOL, mp 127°–128° C.

PREPARATION II

This preparation illustrates a simple, two-step, one-batch reaction of 2,4-bis(trichloromethyl)-6-[3-(2-hydroxyethoxy)styryl]-1,3,5-triazine (meta-MOSTOL), 2,4-tolylene diisocyanate (TDI), and polyoxyethylene nonylphenol ("IGEPAL CO-520") to prepare a mixture containing 80% meta-MOSTOL/TDI/POENP5, 15% [meta-MOSTOL]$_2$/TDI, and 5% [POENP5]$_2$/TDI, which mixture can function as a photoinitiator. (POENP5 is a commercially available polyoxyethylene nonylphenol having a mole ratio of 5 polyoxyethylene units to nonylphenyl units.)

To a stirred dispersion containing 2,4-bis(trichloromethyl)-6-[3-(2-hydroxyethoxy)styryl]-1,3,5-triazine (55.00 g, 0.1151 mole) and 2,4-tolylene diisocyanate (18.2 g, 0.102 mole) in 200 mL of toluene at a temperature of 16° C. was added dibutyltin dilaurate (0.150 g). A slight exotherm raised the temperature of the reaction mixture to 19° C. and the reaction mixture became clear after approximately 20 minutes. The meta-MOSTOL had completely reacted in 5 hours and the resulting mixture was analyzed by GPC and found to contain the following materials: meta-MOSTOL/TDI (54.5 g, 0.0837 mole), (meta-MOSTOL)$_2$/TDI (17.7 g, 0.0314 mole), and 2,4-tolylene diisocyanate (0.9 g, 0.0052 mole).

To this mixture was added a 79.2% solution of polyoxyethylene nonylphenol ("IGEPAL CO-520") (58.92 g, 0.0941 mole) in toluene and the solution was heated to a temperature of 60° C. and maintained at that temperature for 4 hours. Infrared analysis indicated that all of the isocyanate had reacted. The reaction mixture was determined by high performance liquid chromatography (HPLC) analysis to contain approximately 80% (96.0 g) meta-MOSTOL/TDI/POENP5, 15% (17.8 g) [meta-MOSTOL]$_2$/TDI, and 5% (6.0 g)[POENP5]$_2$/TDI. Removal of the toluene under vacuum by means of a rotary evaporator provided a slightly brown viscous syrup. For ease of handling, this material was redissolved in sufficient methyl ethyl ketone to produce a solution having a concentration of approximately 50%.

I claim:

1. A photosensitive, resist-imageable color element comprising in order
   (a) a transparent support layer,
   (b) a color containing photosensitive, resist-imageable layer, and
   (c) a water-removable polymeric layer with water-insoluble organic polymeric particles therein, said particles comprising 0.05% to 2.0% by weight of said water-removable layer.

2. The element of claim 1 wherein said water-removable layer comprises a water-soluble polymer.

3. The element of claim 2 wherein said water-soluble polymer is selected from the group consisting essentially of alkyl ethers of cellulose, polyvinyl alcohol, and polyvinyl pyrrolidone.

4. The element of claim 1 wherein said photosensitive resist-imageable layer comprises a free radical polymerizable ethlenically unsaturated material.

5. The element of claim 1 wherein said photosensitive resist-imageable layer comprises an acryloyl-containing or methacryloyl-containing polymerizable compound.

6. The element of claim 2 wherein said photosensitive resist-imageable layer comprises an acryloyl-containing or methacryloyl-containing polymerizable compound.

7. The element of claim 3 wherein said photosensitive resist-imageable layer comprises an acryloyl-containing or methacryloyl-containing polymerizable compound.

8. The element of claim 1 wherein said particles have a mean diameter of 4 to 10 microns.

9. The element of claim 2 wherein said particles have a mean diameter of 4 to 10 microns.

10. The element of claim 5 wherein said particles have a mean diameter of 4 to 10 microns.

11. The element of claim 6 wherein said particles have a mean diameter of 4 to 10 microns.

12. The element of claim 7 wherein said particles have a mean diameter of 4 to 10 microns.

13. The element of claim 9 wherein the color in the resist imageable layer is provided by at least one pigment.

14. The element of claim 10 wherein the color in the resist imageable layer is provided by at least one pigment.

15. The element of claim 11 wherein the color in the resist imageable layer is provided by at least one pigment.

16. The element of claim 12 wherein the color in the resist imageable layer is provided by at least one pigment.

17. The element of claim 4 wherein said unsaturated material comprise a polymerizable polymer or polymerizable oligomer.

18. The element of claim 5 wherein said unsaturated material comprise a polymerizable polymer or polymerizable oligomer.

19. The element of claim 10 wherein said unsaturated material comprise a polymerizable polymer or polymerizable oligomer.

20. The element of claim 14 wherein said unsaturated material comprise a polymerizable polymer or polymerizable oligomer.

21. A photosensitive, resist-imageable color element comprising in order
   (a) a transparent support layer,
   (b) a color containing photosensitive, resist-imageable layer comprising a free radical polymerizable, ethylenically unsaturated material, and
   (c) a water-removable polymeric layer with water-insoluble organic polymeric particles therein, said particles comprising 0.05% to 2.0% by weight of said water-removable layer.

22. The element of claim 21 wherein said unsaturated material comprises a polymerizable polymer or polymerizable oligomer.

23. A photosensitive, resist-imageable color element comprising in order
   (a) a transparent support layer,
   (b) a color containing photosensitive, resist-imageable layer comprising an acryloyl-containing or methacryloyl-containing polymerizable compound, and
   (c) a water-removable polymeric layer with water-insoluble organic polymeric particles therein.

24. The element of claim 23 wherein said polymerizable compound comprises a polymer or oligomer.

25. The element of claim 23 wherein said particles comprise 0.05% to 2.0% by weight of said water-removable layer.

* * * * *

UNITED STATES PATENT AND TRADEMARK OFFICE
CERTIFICATE OF CORRECTION

PATENT NO. : 5,258,261
DATED : November 2, 1993
INVENTOR(S) : Heller

It is certified that error appears in the above-indentified patent and that said Letters Patent is hereby corrected as shown below:

Column 12, lines 28-29, delete "essentially".

Column 7, line 10, delete "example b 6"
and insert --example 6--.

Signed and Sealed this

First Day of November, 1994

Attest:

BRUCE LEHMAN

*Attesting Officer*     *Commissioner of Patents and Trademarks*